United States Patent [19]

Huber

[11] Patent Number: 4,714,349
[45] Date of Patent: Dec. 22, 1987

[54] PHOTOELECTRIC LENGTH OR ANGLE MEASURING INSTRUMENT

[75] Inventor: Erich Huber, Schoenberg/Geminde Kienberg, Fed. Rep. of Germany

[73] Assignee: Dr. Johannes Heidenhain GmbH, Traunreut, Fed. Rep. of Germany

[21] Appl. No.: 633,337

[22] Filed: Jul. 23, 1984

[30] Foreign Application Priority Data

Aug. 2, 1983 [DE] Fed. Rep. of Germany ....... 3327849

[51] Int. Cl.$^4$ ...................... G01B 11/02; G01B 11/26
[52] U.S. Cl. ................................... 356/374; 33/125 C
[58] Field of Search ................... 356/374; 250/237 G; 33/125 C; 350/276 R, 276 SL; 357/17; 372/36

[56] References Cited

U.S. PATENT DOCUMENTS 4,366,492 12/1982 Kitamura ............................ 372/36
4,581,629 4/1986 Harvey et al. ........................ 357/17

Primary Examiner—R. A. Rosenberger
Attorney, Agent, or Firm—Willian Brinks Olds Hofer Gilson & Lione Ltd.

[57] ABSTRACT

A photoelectric length or angle measuring system for measuring the relative position of two objects includes a graduation of a scale which is scanned by a scanning plate of a scanning unit. The scanning unit includes an illuminating unit for the illumination of the graduations of the scale and the scanning plate. In this illuminating unit there is arranged a light emitting diode on a surface of a carrier. For the improvement of the light radiating characteristics of the illuminating unit, reflections in the direction of the graduations of the scale and the scanning unit of light beams emerging laterally from the light emitting diode are avoided by properly configuring the surface of the carrier. In alternate embodiments, this surface of the carrier consists of a light absorbing material, is covered by a light absorbing material, or is provided with a dimension along the measuring direction no greater than that of the light emitting diode.

7 Claims, 5 Drawing Figures

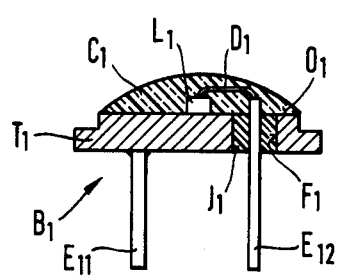
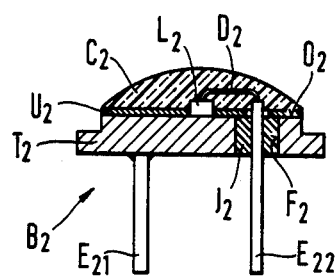
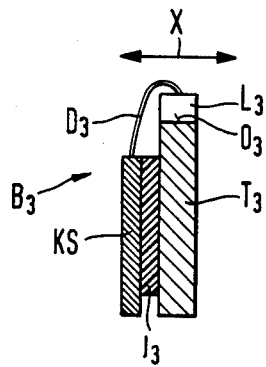

PHOTOELECTRIC LENGTH OR ANGLE MEASURING INSTRUMENT

BACKGROUND OF THE INVENTION

This invention relates to an improved light source carrier for a photoelectric position measuring system for measuring the relative position of two objects, of the type comprising a graduation carrier, adapted to be coupled to a first object, a graduation defined by the graduation carrier, and a scanning unit adapted to be coupled to a second object, the position of which is to be measured, said scanning unit comprising a scanning plate and at least one photosensor mounted in the scanning unit to scan the graduation.

Photoelectric measuring systems are typically used to measure the relative position of two objects, such as two components of a processing machine. In such measuring systems, a graduation of a scale is scanned by a scanning graduation of a scanning plate and associated photoelectric scanning elements included in the scanning unit. A light source is provided in the scanning unit to illuminate the graduations of the scale and the scanning plate. Light produced by the light source is modulated by the graduations as a result of their relative movement, and this modulated light is detected by the photoelectric scanning elements of the scanning unit, which generate periodic electric scanning signals. Preferably, the photoelectric scanning elements should be illuminated as uniformly as possible by the light source.

Often when a commercially available light emitting diode is used in the light source, not all of the light is directed towards the graduations. Rather, a portion of the light emerges laterally from the light emitting diode and can be reflected from the carrier of the light emitting diode or other components present in the environment. The reflection of such laterally directed light in the direction of the graduations of the scale and of the scanning plate can give rise to a considerable deterioration of the degree of modulation of the periodic scanning signals. A diaphragm or blind that is arranged on the surface of the photodiode through which the light passes can, of course, improve the degree of modulation. However, this approach can result in a severe diminution of the amplitude of the scanning signals.

SUMMARY OF THE INVENTION

The present invention is directed to an improved light source for a length or angle measuring system, which reduces the intensity of stray light that can interfere with the proper generation of scanning signals.

According to this invention, a measuring system of the type described initially above is provided with a light source carrier mounted in the scanning unit, and a light source mounted to the light source carrier to illuminate the graduations. The light source carrier is configured to prevent light emerging from the light source from reflecting off of the light source carrier in the direction of the scanning plate and the graduation.

The present invention provides important advantages in that the light radiating characteristics of the illuminating unit are improved in a remarkably simple and direct manner. For this reason, the degree of modulation and the amplitude of the scanning signals, and thereby the accuracy and the reliability of the measurement, are all improved. Further advantageous features of the invention are set forth in the dependent claims.

The invention itself, together with further objects and attendant advantages, will best be understood by reference to the following detailed description, taken in conjunction with the accompanying drawings.

BRIEF DESCRIPTION OF THE DRAWINGS

FIGS. 3a–3c are cross-sectional views of first, second and third preferred embodiments of the illuminating unit of this invention, respectively.

DETAILED DESCRIPTION OF THE PRESENTLY PREFERRED EMBODIMENTS

Figure 1:
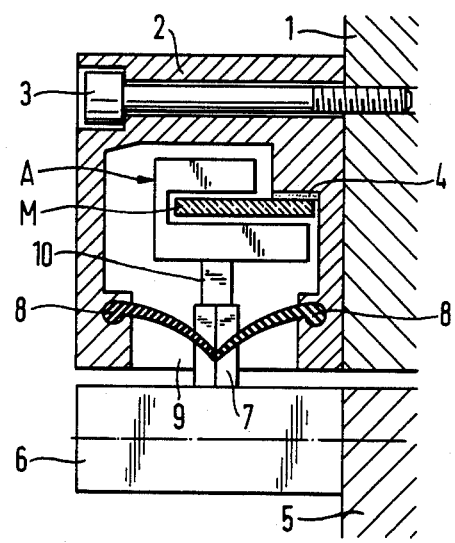
FIG. 1 is a cross-sectional view through a photoelectric length measuring system of type suitable for use with the presently preferred embodiments of this invention.
Figure 2:
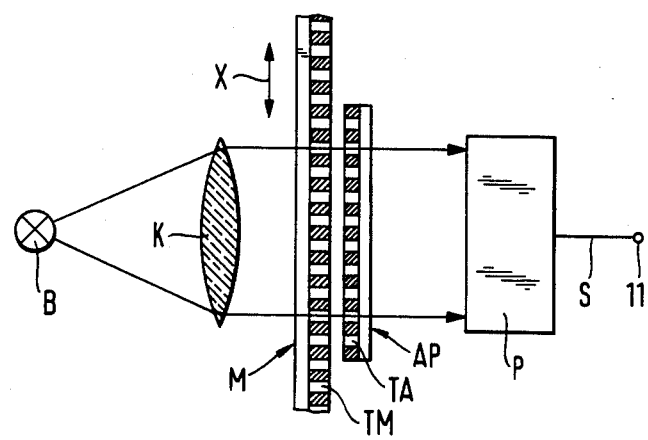
FIG. 2 is a schematic representation of the photoelectric scanning arrangement included in the measuring system of FIG. 1.

Turning now to the drawings, FIG. 1 shows a cross-sectional view of an encapsulated photoelectric length measuring system which includes a housing 2 in the form of a hollow profile. This housing 2 is mounted to the bed 1 of a processing machine by means of a screw 3. A scale M which defines a graduation TM (FIG. 2) is mounted by means of an elastic adhesive layer 4 in the interior of the housing 2. This scale M is scanned by a scanning unit A which includes a scanning plate AP (FIG. 2). The processing machine includes a slidepiece 5 which is movable relatively to the bed 1. A mounting foot 6 is fastened to the slidepiece 5 in any suitable manner, and this mounting foot 6 is connected by means of a sword-shaped follower 7 to a carrier 10. The carrier 10 is fastened to the scanning unit A and transfers relative movement of the slidepiece 5 with respect to the bed 1 to the scanning unit A. The sword-shaped follower extends through a slit 9 defined by the housing 2. This slit 9 is closed by sealing lips 10 around the sword-shaped follower 7 in order to completely seal the housing 2.

FIG. 2 shows a schematic representation of the photoelectric scanning arrangement of the scanning unit A. As shown in FIG. 2, light beams generated by an illuminating unit B pass through a collimating lens K, through the scale M and the scanning plate AP and fall upon a photosensor P, which is associated with the graduation TA of the scanning plate AP. As the scanning plate AP moves relative to the scale M in the measuring direction X, the photosensor P generates a periodic electric scanning signal S in response to the modulation of light by the graduations TM,TA. This scanning signal S is applied via a connection 11 (in a manner not shown) to an evaluating unit, which is connected with a display unit for the display of the position of the slidepiece 5 with respect to the bed 1.

FIGS. 3a, 3b and 3c represent three presently preferred embodiments of the illuminating unit B of this invention. All three of these embodiments improve the light radiation characteristics of the illuminating unit B by avoiding reflections in the direction of the graduations TM,TA of the scale M and the scanning plate AP of light beams emerging from the light source L.

As shown in FIG. 3a, the first preferred embodiment $B_1$ of the illuminating unit of this invention includes a light source carrier $T_1$ which defines a surface $O_1$. A light emitting diode $L_1$ is mounted on the surface $O_1$. In order to avoid the reflection of light beams emerging laterally from the photodiode $L_1$, either only the surface $O_1$ or the entire carrier $T_1$ consists of a light absorbing material. Current is supplied to the light emitting diode $L_1$ by means of a first contact pin $E_{11}$ which is soldered to the electrically conducting carrier $T_1$, and by means of a second contact pin $E_{12}$, which is passed through an insulating layer $J_1$ in a bore $F_1$ of the carrier $T_1$ and is connected with the light emitting diode $L_1$ via a wire $D_1$. In order to protect the wire $D_1$, the wire $D_1$ and the photodiode $L_1$ are embedded in a layer $C_1$ of a photopermeable synthetic material.

The illuminating unit $B_2$ shown in FIG. 3b includes a light source carrier $T_2$ which defines a surface $O_2$. A light emitting diode $L_2$ is mounted on the surface $O_2$. In order to avoid reflections of light beams emerging laterally from the light emitting diode $L_2$, a separate layer $U_2$ of photoimpermeable and light absorbing material is arranged on the surface $O_2$ of the carrier $T_2$ around the light emitting diode $L_2$. This layer $U_2$ at least partially covers the side surfaces of the photodiode $L_2$. Current is supplied to the photodiode $L_2$ by means of a first contact pin $E_{21}$, which is soldered to the electrically conducting carrier $T_2$, and by means of a second contact pin $E_{22}$, which is passed via an insulating layer $J_2$, through a bore $F_2$ of the carrier $T_2$ and is connected via a line wire $D_2$ with the light emitting diode $L_2$. In order to protect the wire $D_2$, the wire $D_2$ together with the photodiode $L_2$ are both embedded in a layer $C_2$ of photopermeable synthetic material.

The illuminating unit $B_3$ shown in FIG. 3c includes a light source carrier $T_3$ which defines a surface $O_3$ on which is mounted a light emitting diode $L_3$. In order to avoid reflections of light beams emerging laterally from the photodiode $L_3$, the surface $O_3$ of the carrier $T_3$ presents the same dimension along the X direction as the light emitting diode $L_3$. The dimension of the surface $O_3$ of the carrier $T_3$ perpendicular to the measuring direction X can be chosen at will as necessary to provide sufficient stability to the carrier $T_3$. In order to provide current to the light emitting diode $L_3$ the strip form carrier $T_3$ serves as a first contact. A contact strip KS serves as a second contact, and the contact strip KS is connected via a wire $D_3$ with the light emitting diode $L_3$ and is electrically insulated with respect to the carrier $T_3$ by means of an insulating layer $J_3$.

It should be apparent that each of the three preferred embodiments described above operates to prevent light from reflecting off of the light source carrier and onto the graduations TM,TA. In this way, the intensity of stray light within the encapsulated measuring instrument is markedly reduced and measuring accuracy is improved.

Of course, it should be understood that a wide range of changes and modifications can be made to the preferred embodiments described above. It is therefore intended that the foregoing detailed description be regarded as illustrative rather than limiting, and that it be understood that it is the following claims, including all equivalents, which are intended to define the scope of this invention.

I claim:

1. In a photoelectric position measuring system for accurately measuring the relative position of two objects of the type comprising a graduation carrier adapted to be coupled to a first object, a graduation defined by the graduation carrier, and a scanning unit operative to scan the graduation and adapted to be coupled to a second object, the position of which is to be measured, the scanning unit comprising a scanning plate, a light emitting diode element positioned to illuminate the graduation, and at least one photosensor allocated to the scanning plate to scan the graduation, the improvement comprising:

the light emitting diode element situated on a carrier; and the carrier comprising a light absorbing surface immediately surrounding the light emitting diode element, the carrier and light absorbing surface operative to substantially prevent light rays emerging laterally from the light emitting diode element from undergoing reflections off the carrier in the direction of the graduation and the scanning plate and thereby improve the accuracy of the relative position measurement.

2. The invention of claim 1 wherein the light absorbing surface is formed by the carrier of the light emitting diode.

3. The invention of claim 1 wherein the light absorbing surface is formed by a light absorbing layer applied to the carrier in the region immediately surrounding the light emitting diode.

4. The invention of claim 1 wherein the light emitting diode comprises a luminescent diode.

5. In a photoelectric position measuring system for accurately measuring the relative position of two objects of the type comprising a graduation carrier adapted to be coupled to a first object, a graduation defined by the graduation carrier, the graduation defining a measuring direction, and a scanning unit operative to scan the graduation and adapted to be coupled to a second object, the position of which is to be measured, the scanning unit comprising a scanning plate, a light emitting diode element positioned to illuminate the graduation and the scanning plate, and at least one photosensor allocated to the scanning plate to scan the graduation, the scanning unit operative to produce at least one scanning signal modulated in response to the graduation, the scanning signal defining an amplitude, the improvement comprising:

the light emitting diode element situated adjacent a carrier; and the carrier dimensioned in the measuring direction such that light rays emerging laterally from the light emitting diode undergo substantially no reflections in the direction of the graduation and the scanning plate and thereby substantially improve at least one of (1) the degree of modulation and (2) the amplitude of the scanning signal.

6. The invention of claim 5 wherein the light emitting diode comprises a luminescent diode.

7. In a photoelectric position measuring system for accurately measuring the relative position of two objects of the type comprising a graduation carrier adapted to be coupled to a first object, a graduation defined by the graduation carrier, the graduation defining a measuring direction, and a scanning unit operative to scan the graduation and adapted to be coupled to a second object, the position of which is to be measured, the scanning unit comprising a scanning plate, a light permeable encapsulating body, a light emitting diode element located within the encapsulating body and operative to illuminate the graduation, and at least one photosensor allocated to the scanning plate to scan the graduation and produce at least one scanning signal defining an amplitude and modulated in response to the graduation and scanning plate, the improvement comprising:

the light emitting diode element positioned adjacent a carrier located substantially within the encapsulating body; and the carrier comprising a light absorbing surface immediately surrounding the light emitting diode element and operative to substantially prevent light rays emerging laterally from the light emitting diode from reflecting off the carrier in the direction of the graduation and scanning plate, the light absorbing surface cooperating to improve at least one of (1) the modulation and (2) the amplitude of the scanning signal and thereby improve the measuring accuracy of the measuring system.

* * * * *